United States Patent [19]

Misu

[11] Patent Number: 4,819,046

[45] Date of Patent: Apr. 4, 1989

[54] INTEGRATED CIRCUIT WITH IMPROVED PROTECTIVE DEVICE

[75] Inventor: Kazuhiro Misu, Tokyo, Japan

[73] Assignee: NEC Corporation, Tokyo, Japan

[21] Appl. No.: 52,923

[22] Filed: May 22, 1987

[30] Foreign Application Priority Data

May 22, 1986 [JP] Japan ................................. 61-118760

[51] Int. Cl.$^4$ ..................... H01L 29/78; H01L 27/02; H01L 29/46
[52] U.S. Cl. .................................. 357/23.13; 357/51; 357/71; 307/200.1
[58] Field of Search ........................ 357/23.13, 71, 51; 307/200 B

[56] References Cited

U.S. PATENT DOCUMENTS

| 4,605,980 | 8/1986 | Hartranft et al. | 357/23.13 |
| 4,656,732 | 4/1987 | Teng et al. | 357/71 |
| 4,691,217 | 9/1987 | Ueno et al. | 357/23.13 |
| 4,692,781 | 9/1987 | Rountree et al. | 357/23.13 |
| 4,710,791 | 12/1987 | Shirato et al. | 357/51 |

FOREIGN PATENT DOCUMENTS

| 0043284 | 1/1982 | European Pat. Off. | 357/23.13 |
| 0130412 | 1/1985 | European Pat. Off. | 357/23.13 |
| 0002663 | 1/1981 | Japan | 357/23.13 |
| 0224164 | 12/1984 | Japan | 357/23.13 |

Primary Examiner—Eugene R. LaRoche
Assistant Examiner—Michael B. Shingleton
Attorney, Agent, or Firm—Sughrue, Mion, Zinn, Macpeak & Seas

[57] ABSTRACT

An improved protective device for an integrated circuit which can be fabricated on a reduced area is disclosed. The protective device comprises a punch-through type transistor connected between an input pad and a reference voltage terminal and made of first and second spaced-apart impurity regions, and a resistor region extending from a part of outer side of the first impurity region and running under the input pad.

8 Claims, 3 Drawing Sheets

INTEGRATED CIRCUIT WITH IMPROVED PROTECTIVE DEVICE

BACKGROUND OF THE INVENTION

The present invention relates to a semiconductor integrated circuit fabricated on a semiconductor substrate, and more particularly to a protective device for preventing an integrated circuit fabricated on the same substrate from destruction due to excessive electrostatic charges.

In order to prevent an active element such as a MOS field effect transistor and a bipolar transistor from destruction due to excessive electrostatic charge applied to an external terminal which is connected to the active element, a protective device is connected with the external terminal.

A typical example of a known protective device is composed of a resistor connected in series between the external terminal and an electrode of the active element such as a gate of a MOS transistor and a protecting MOS transistor connected between the electrode of the active element and a ground potential source with a gate connected to the ground potential source. The external terminal is formed by a bonding pad having a relatively large area and the resistor is formed by a diffusion region extending from the bonding pad to a drain of the protecting MOS transistor.

The diffusion region as the resistor is required to be formed with a relatively large length to obtain a predetermined resistance value. Accordingly, a relatively large area is required to fabricate the protecting device on a semiconductor substrate. Furthermore, if another diffusion region is formed adjacent to the diffusion region (resistor diffusion region) serving as the resistor, a parasitic bipolar transistor is produced therebetween, and when an excessive voltage is applied to the bonding pad and the resistor diffusion, an abnormal current flows between the resistor diffusion region and the above additional diffusion region. Therefore, a certain distance must be kept between the resistor diffusion region and the another diffusion region to avoid the above parasitic transistor. Thus, the further area on the semiconductor substrate have been required to arrange the protective device and a predetermined function circuit on the same substrate.

SUMMARY OF THE INVENTION

It is one object of the present invention to provide a semiconductor integrated circuit with an improved protective device.

It is another object of the present invention to provide a high-density semiconductor integrated circuit having a reduced-sized protective device.

The protective device for a functional circuit according to the present invention comprises a punch-through type protective transistor connected between an input electrode or pad and a reference voltage terminal and a resistor connected between the input electrode and the functional circuit.

The punch-through type protective transistor is made of first and second spaced-apart impurity regions formed in a semiconductor substrate. The first region is electrically connected to the input pad and the second impurity region is electrically connected to the reference voltage terminal.

The resistor is made of a strip-shaped impurity region having one end connected to the opposite side of the first impurity region not facing the second region and extends therefrom under the input pad towards the functional circuit. The input pad thus overlaps a part of the strip-shaped resistor region.

DETAILED DESCRIPTION OF THE INVENTION

Figure 1:
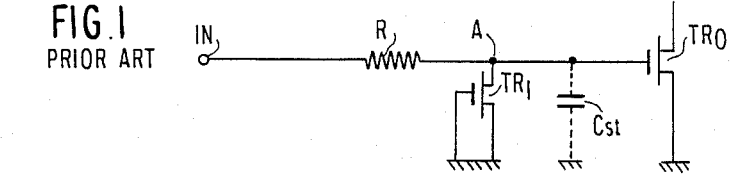
FIG. 1 is a schematic circuit diagram of a protective device according to a prior art.
Figure 2:
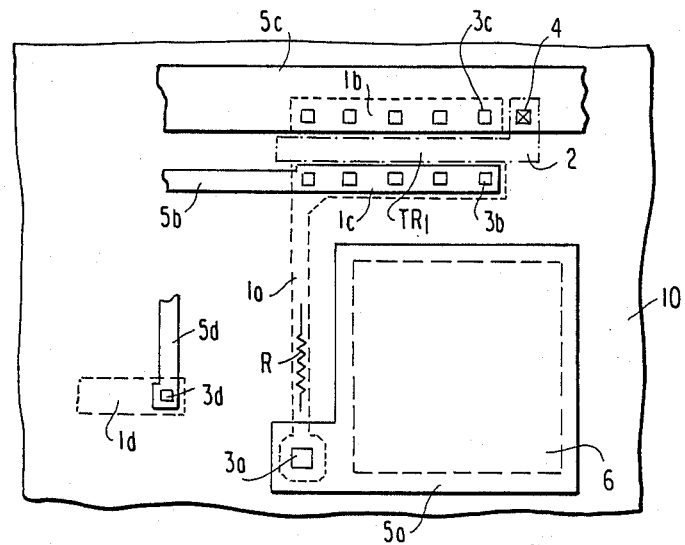
FIG. 2 is a plan view of a protective device according to a prior art.

FIG. 1 shows a circuit structure of a typical protective device. An input terminal IN is connected to a gate of a MOS transistor TR0 to be protected via a resistor R. A drain of a protecting MOS transistor TR1 is connected to a node A of the resistor R with a gate and a source connected to a ground potential. An excessive voltage applied to the input terminal IN is lowered in value by a time constant formed of the resistance of the reisstor R and a stray capacitance Cst at the node A. If the value of the voltage at the node A is still higher than a break-down voltage of the transistor TR1, the transistor TR1 becomes conductive to bypass the excessive charge at the node A to the ground potential. Thus, an excessive voltage applied to the input terminal IN is effectively suppressed by the resistor R and the protective transistor TR1 and destruction of the transistor TR0 is prevented.

A typical example of a practical structure of the conventional protective device is shown.

N-type diffusion regions 1a, 1b, 1c and 1d are formed on a P-type semiconductor substrate 10. The N-type regions 1b and 1c serve as the source and drain of the protective transistor TR1, respectively. The region 1a serves as the resistor R and is consecutively formed with the region 1c. The N-type region 1d is a part of a diffusion region of a functional circuit formed with the protective device. A bonding pad 6 as the input terminal formed of a metal pattern 5a of aluminum is connected to an input end of the region 1a via a contact 3a. A wiring 5C made of aluminum is provided with a ground potential and connected to the region 1b through contacts 3c. An input wiring 5b is connected to the region 1c via contacts 3b and to a gate of an input MOS transistor (not shown) such as TR0 in FIG. 1. A wiring 5d made of aluminum is one of wirings connected to the region via a contact 3d. A gate electrode 2 made of a polycrystalline silicon (polysilicon) is connected to the ground wiring 5c. The MOS transistor TR1 thus arranged functions as a punch-through type transistor so that a depletion layer extends and bridges between the drain and the source regions 1c and 1b under the excess voltage, thereby discharging the excess voltage to the ground.

Under recent development of integrated circuit fabrication techniques are employed extremely thin gate oxide films which are liable to be damaged by a relatively low excess voltage. This means that the protection circuit should promptly respond to the excess voltage and forcibly lowered the voltage level at the input wiring 5b. Experiences to the prior art teach us that high junction leakage currents are not observed after application of an excess voltage five time to the bonding pad 6. The excess voltage is supplied from a capacitor with a capacitance value of 100 pF through a resistance of 1.5 kΩ after charging the capacitor to 2000 V.

However the effectiveness of this prior art protective device depends on a circuit layout of an integrated circuit fabricated on the same substrate. The protective device has the resistor 1a connected to the bonding pad 6 at the contact 3a. When an excess high voltage is applied to the bonding pad 6, the impurity region 1a near the contact 3a is liable to breakdown. If the substrate 10 has the impurity region 1d with a different voltage level in the vicinity of the contact 3a, a leakage current concentrates in a limited area of the impurity region 1d, thereby causing the temperature of the substrate 10 around the electric path to rapidly rise. This high temperature results in the destruction of the pn junction of the region 1d and short-circuits of aluminium leads such as 5d running over the pyrogen due to the softening thereof. Moreover, when the impurity region 1a is forwardly biased under a surge current, the excess voltage reaches to the pn junction formed between the substrate 10 and the impurity region 1d and then destroys the pn junction. Especially, if the impurity region 1d has a small area with only one contact 3d connecting the region 1d to the above conductive layer 5d, the influence of the destruction is extremely serious.

Thus, the diffusion region 1d must be distant from the region 1a and a certain distance has to be kept therebetween. In other words, the conventional protective device composed of the resistor R and the transistor TR1 must be formed on an area apart from a functional circuit formed on the same semiconductor substrate, as well as its own relatively large size of the protective device.

Thus, the integrated circuit provided with the conventional protective device has the limitation in layout of circuit elements on the same semiconductor substrate and it has been difficult to obtain a high-integration structure of integrated circuit.

Referring to FIGS. 3 to 8, a major part of the integrated circuit according to a preferred embodiment of the present invention is explained.

Figure 8:
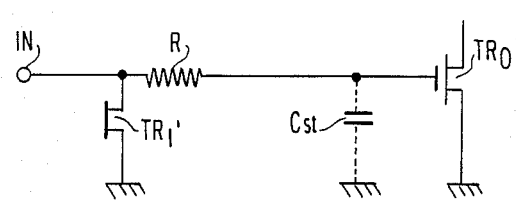
FIG. 8 is a schematic circuit diagram of a protective device according to the present invention.

The basic circuit structure of the protective device of the present invention is shown in FIG. 8. As shown in FIG. 8, a punch-through type protective transistor TR1' is employed in place of TR1 of FIG. 1 and the transistor TR1' is connected to the input end of the resistor R.

Figure 3:
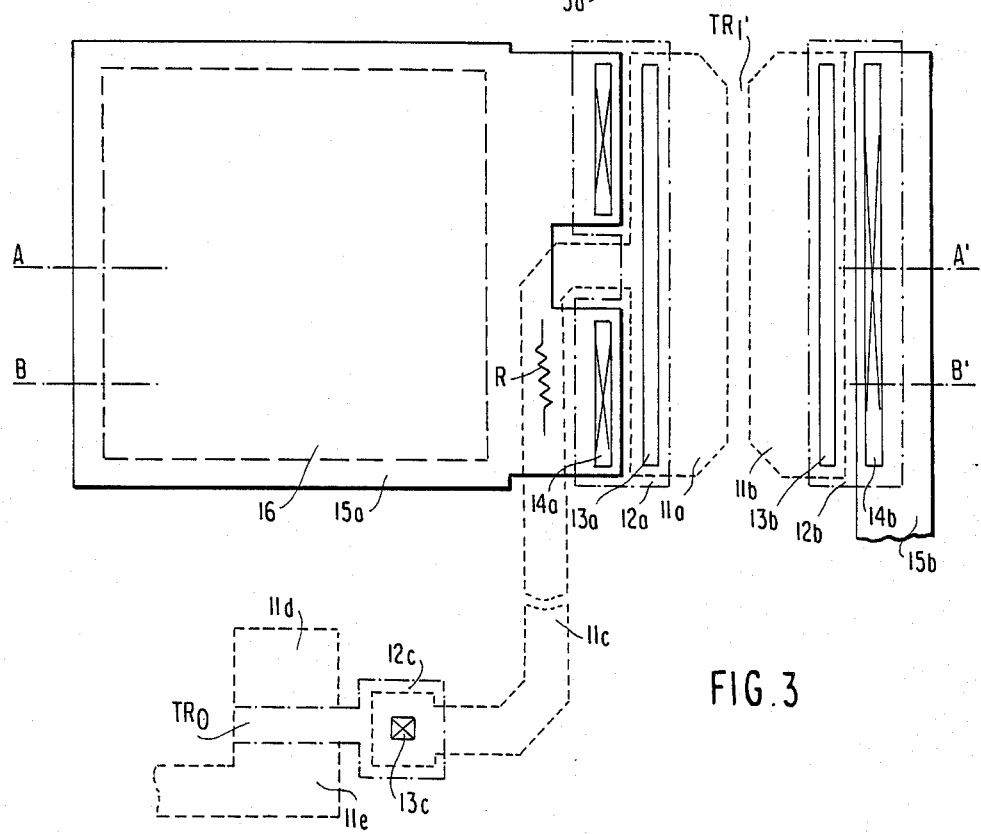
FIG. 3 is a plan view showing a protective device and a MOS transistor to be protected.
Figure 4:
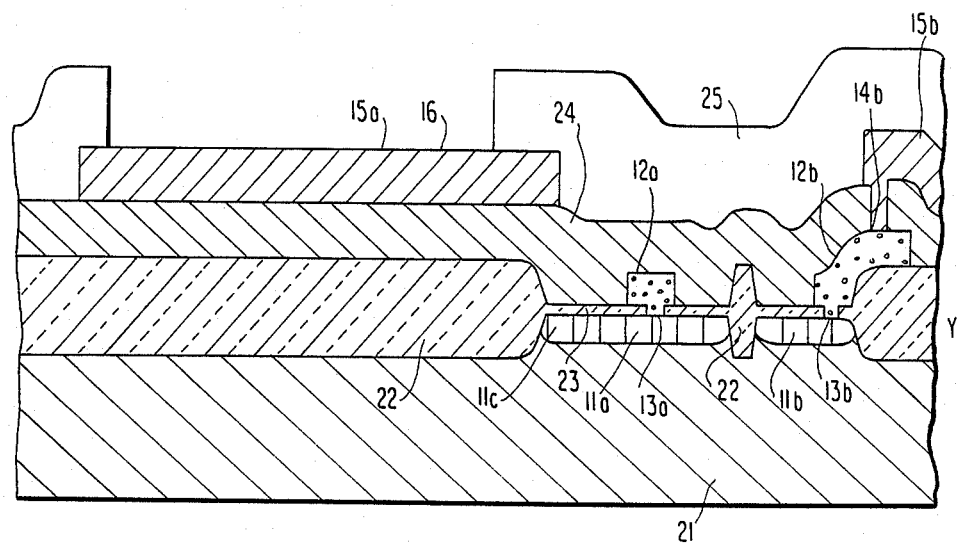
FIG. 4 is a sectional view along a line A-A' in FIG. 3.

The protective device is implemented on a P-type silicon substrate 21 (FIGS. 3 and 4). In the surface portion of the silicon substrate 21 are formed N-type diffusion regions 11a and 11b of 100 microns in length (FIGS. 3–6) extending substantially in parallel to each other and with a gap of 4 microns therebetween and an N-type diffusion region 11c (FIGS. 3–6) extending from a center portion of a left (outer) side of the region 11a and serving as the diffusion resistor R. The surfaces of these diffusion regions 11a, 11b and 11c are covered with a thin insulating film 23 of silicon dioxide except for contact areas and the other surface of the protective device is covered with a thick field insulating layer 22 of silicon dioxide. Polysilicon connecting layers 12a and 12b are electrically contacted with the N-type diffusion regions 11a and 11b, respectively, through contact holes 13a and 13b open in the thin insulating films 23 and extended on the upper surface of the thick insulating film 22, respectively. The contact holes 13a and 13b are of a slit shape extending along the outer edges of the N-type diffusion regions 11a and 11b, respectively, to a length almost equal to but less than the length of the diffusion regions 11a and 11b. The polysilicon connecting layer 12a is contacted with the region 11a through the entire length of the contact hole 13a and its two side portions are extended onto the near-by thick field insulating layer provided adjacently to and along the outer edge of the region 11a. The polysilicon connecting layer 12b is contacted with the N-type diffusion region 11b via the entire length of the contact hole 13b and extended onto the thick field insulating layer located adjacent to and along the outer edge of the region 11b. A polysilicon gate 12c is also formed simultaneously with the polysilicon layers 12a and 12b and forms a functional MOS transistor TR0 to be protected together with N-type source and drain regions 11e and 11d (FIGS. 3 and 6). The silicon gate 12c is connected to an output end of the diffusion region 11c at a contact hole 13c.

The surface of the substrate 21 with the polysilicon layers 12a, 12b and 12c is covered by an insulating layer 24 formed of silicon dioxide. An aluminum bonding pad 15a as an input terminal and an aluminum wiring 15b are formed on the insulating layer 24. The bonding pad 15a is connected to the two side portions of the polysilicon layer 12a on the thick field insulating layer through contact holes 14a formed in the insulating layer 24 (FIGS. 3, 5 and 7) thereby to achieve an electrical connection between the input terminal 15a and the N-type diffusion region 11a. The wiring 15b is connected to the polysilicon layer 12b through a contact hole 14b formed in the insulating layer 24 at the location over the thick insulating layer 22 (FIGS. 3, 4, 5 and 7) thereby to achieve an electrical connection between the diffusion region 11b and a ground potential which is supplied to the wiring layer 15b. The surface of the substrate 21 except a bonding area 16 of the bonding pad 15a is covered by an insulating layer 25, which may be formed of silicon dioxide, silicon nitride, phosphosilicate glass, or polyimid film.

Figure 5:
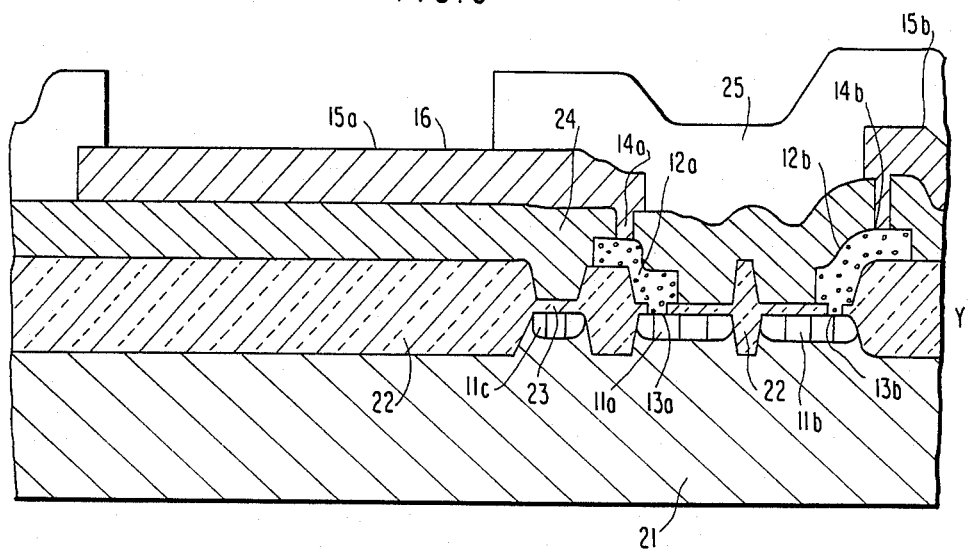
FIG. 5 is a sectional view along a line B-B' in FIG. 3.
Figure 6:
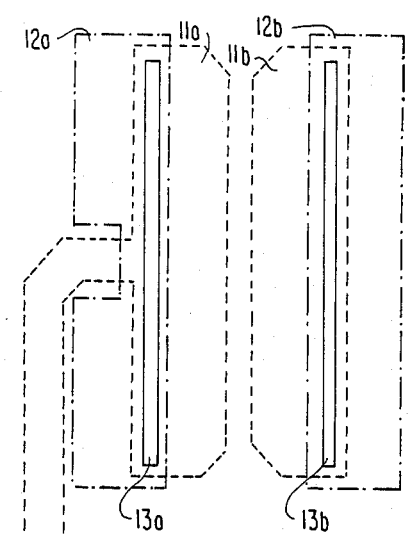
FIG. 6 is a plan view showing patterns of diffusion regions and polysilicon (polycrystalline silicon) layer.

As shown in FIGS. 4 and 5, the thick insulating layer 22 of a thickness of 3000 to 9000 angstroms (favorably 4000 to 7000 angstroms) is provided between the N-type diffusion regions 11a and 11b which form a punch-through type protective transistor TR1' with the insulating layer 22 therebetween.

The punch-through voltage of this transistor TR1' is favorably in the range of 20 to 40 volts.

In operation, when an excess voltage is applied to the bonding pad 15a, the excess voltage propagates through the polysilicon layer 12a to the N-type region 11a. The N-type region 11a and the N-type region 11b supplied with the ground potential are spaced apart at the relative narrow interval such as 4 microns via the part of the insulating layer 22, a depletion layer (not shown) extending from the N-type region 11a applied with the excess voltage reaches the N-type diffusion region 11b. Thus, the electrical path is achieved between the diffusion regions 11a and 11b to thereby discharge the excess voltage to the ground and suppress the voltage at the diffusion region 11a to less than a predetermined value. This suppressed voltage is further lowered and moderated through the resistor diffusion region 11c and then applied to the silicon gate 12c of the transistor TR0 to be protected. In the embodiment, the diffusion regions 11a and 11b are spaced apart at the interval of about 4 microns. However, this interval may be narrower than 4 microns when the integrated circuit is very sensitive to the excess voltage. The inner corners of the diffusion regions 11a and 11b are cut out as shown in FIGS. 3 and 6 so that the interval between the diffusion regions 11a and 11b is lengthened at the end (side) portions, whereby undesired punch-through is prevented from occuring at the end portions of the interval at a voltage lower than the predetermined voltage.

Since the resistor diffusion region 11c is extended from a control portion of the outer edge of the diffusion region 11a towards the bonding pad 15a to run away from the channel of the punch-through transistor TR1' and then bent to run under the bonding pad 15a in the direction normal to the current path of the punch-through transistor TR1'. Therefore, the resistor diffusion region 11c is hardly effected by electric carriers generated at the channel region of the transistor TR1' by the excess voltage. Moreover, an area under the bonding pad 15a is utilized to form the resistor diffusion region 11c, and an area required by the protective device composed of the transistor TR1' and the resistor R can be reduced.

The polysilicon connecting layers 12a and 12b are located between the bonding pad 15a and the region 11a and between the wiring 15b and the region 11b, respectively. Therefore, even when the bonding pad 15a or the wiring 15b is heated and partially melted by the excess voltage applied to the bonding pad 15a, the melted aluminum is prevented from reaching the surface of the semiconductor substrate 21 due to presence of the polysilicon layers 12a and 12b. Thus, so-called alloy-spike phenomenon by the melted aluminum can be effectively prevented.

Figure 7:
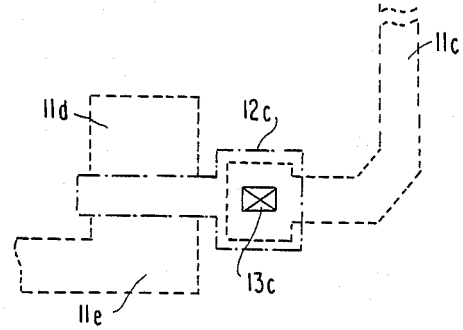
FIG. 7 is a plan view showing a pattern of a metal layer.
Figure 7:
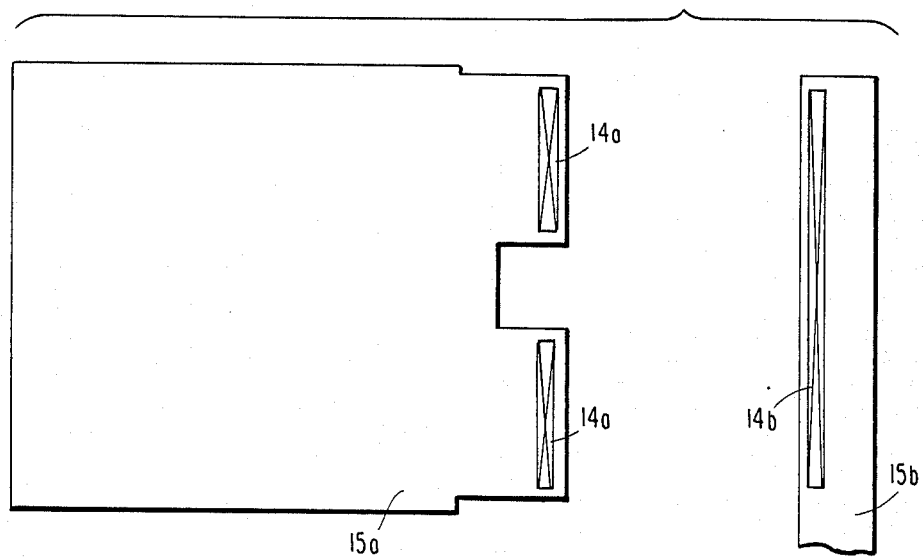

FIG. 6 shows layout patterns of the N-type diffusion regions 11a, 11b, 11c, 11d and 11e, the polysilicon layers 12a, 12b and 12c and the contact holes 13a, 13b and 13c, while FIG. 7 is a layout of the aluminum layer 15a and 15b with contact regions 14a and 14b.

As has been understood from the foregoing description, the protective device according to the present invention is provided with the diffusion region 11a spacing apart from the diffusion region 11b via the narrow distance such as 4 microns so that the excessive voltage is effectively discharged to the ground regardless of existence of another diffusion region which forms part of a circuit element of the functional circuit fabricated on the same substrate.

I claim:

1. A protective device for a functional circuit fabricated on a major surface of a semiconductor substrate of a first conductivity type, comprising first and second regions of a second conductivity type spaced apart from each other and formed at said major surface of said semiconductor substrate, each of said first and second regions having at least a first side and a second side opposite to said first side, the first side of said first region and the first side of said second region facing to each other substantially in parallel and being spaced apart via an isolating area, an insulating layer overlying said major surface of said semiconductor substrate to cover at least said first and second regions, a conductive layer formed on said insulating layer near the second side of said first region, said conductive layer being supplied with an external signal and electrically connected to said first region, a third region of said second conductivity type formed at said major surface of said semiconductor substrate and having at least first and second opposite ends, said third region being connected at its first end to a central part of said second side of said first region and extending therefrom through a region underlying said conductive layer, a wiring layer electrically connected to said second region and supplied with a reference potential, and means for connecting the second end to said third region of said functional circuit.

2. The protective device according to claim 1, in which a width of said isolating area is about 4 microns or less.

3. The protective device according to claim 1, in which said conductive layer is connected to said first region through a first polysilicon layer formed over said second side of said first region and said wiring layer is connected to said second region through a second polysilicon layer formed over said second side of said second region opposite to said first side thereof.

4. The protective device according to claim 1, in which said isolation area is formed of an insulating material.

5. An integrated circuit comprising a semiconductor substrate of a first conductivity type, a first rectangular region of a second conductivity formed in said substrate and having first and second parallel longitudinal sides, a second rectangular region of said second conductivity type formed in said substrate and having first and second parallel longitudinal sides, the first side of said first rectangular region being spaced apart in parallel, a resistor region of said second conductivity type formed in said substrate, said resistor region being connected to a central part of said second side of said first region, a first insulating layer substantially covering the surface of said first and second rectangular regions and said resistor region, a second insulating layer substantially covering the surface of said semiconductor substrate other than said first and second rectangular regions and said resistor region, said first insulating layer being thinner than said second insulating layer, a first polysilicon layer formed on said first rectangular region in parallel with said second side thereof via said first insulating layer and contacted with said first rectangular region through a contact hole formed in said first insulating layer, a second polysilicon layer formed on said second rectangular region via said first insulating layer in parallel with said second side of said second rectangular region and contacted with said second rectangular region through a contact hole formed in said first insulating layer, a third insulating layer covering said first and second polysilicon layers and said first and second insulating layers, a first aluminum layer formed on said third insulating layer and over a part of said first rectangular region and a part of said resistor region, said first aluminum layer being supplied with an external signal and connected to said first polysilicon layer through a contact hole formed in said third insulating layer, a second aluminum layer formed on said third insulating layer and connected to said second rectangular region through a contact hole formed in said third insulating layer, said second aluminum layer being supplied with a reference potential, a transistor formed in said substrate, and means for connecting a part of said resistor region to said transistor.

6. A protective device for a functional circuit fabricated on a major surface of a semiconductor region of a first conductivity type, comprising an insulating layer, a metal input pad formed at said major surface via said insulating layer; a reference voltage wiring supplied with a reference voltage and formed at said major surface via said insulating layer; a punch-through transistor having a channel region, first and second regions of a second conductivity type spaced apart via said channel region, each of said first and second regions having a first side wall facing said channel region and a second side wall opposite to said first side wall, said first region serving one of a drain and a source of said punch-through transistor and said second region serving as the other of said drain and said source, said first region being electrically connected to said metal input pad, and said second region being electrically connected to said reference voltage wiring; a resistor region of said second conductivity type, having first and second ends and being formed in a strip pattern, said first end of said resistor region being directly connected to a central portion of said second side wall of said first region; and means for connecting the second end of said region to said functional circuit.

7. The protective device according to claim 6, in which said punch-through transistor has a thick insulating layer formed on said channel region, said thick insulating having a thickness of a range of 3000 angstroms to 9000 angstroms.

8. The protective device according to claim 6, in which a first polysilicon layer is provided between said metal pad and said first region and a second polysilicon layer is provided between said reference voltage wiring and said second region.

* * * * *